United States Patent
Streit et al.

(10) Patent No.: US 6,465,289 B1
(45) Date of Patent: *Oct. 15, 2002

(54) METHOD OF FABRICATING MONOLITHIC MULTIFUNCTION INTEGRATED CIRCUIT DEVICES

(75) Inventors: Dwight C. Streit, Seal Beach; Donald K. Umemoto, Manhattan Beach; Aaron K. Oki; Kevin W. Kobayashi, both of Torrance, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/675,248

(22) Filed: Jul. 1, 1996

Related U.S. Application Data

(62) Division of application No. 08/333,538, filed on Nov. 2, 1994, now abandoned.

(51) Int. Cl.[7] .............................................. H01L 21/338

(52) U.S. Cl. ...................................... 438/167; 437/172

(58) Field of Search ................................ 438/167, 169, 438/170, 172, 171, 189, 190, 312, 314

(56) References Cited

U.S. PATENT DOCUMENTS

| | | |
|---|---|---|
| 4,789,645 A | 12/1988 | Calviello et al. |
| 4,955,085 A | 9/1990 | Woody |
| 4,996,163 A | 2/1991 | Sasaki |
| 5,034,337 A | 7/1991 | Mosher et al. |
| 5,051,372 A * | 9/1991 | Sasaki .................. 438/170 |
| 5,066,605 A | 11/1991 | Kasper et al. |
| 5,066,925 A | 11/1991 | Freitag |
| 5,075,239 A | 12/1991 | Tegude |
| 5,077,231 A | 12/1991 | Plumton et al. |
| 5,162,243 A | 11/1992 | Streit et al. |
| 5,166,083 A | 11/1992 | Bayraktaroglu |
| 5,213,987 A | 5/1993 | Bayraktaroglu |
| 5,223,449 A | 6/1993 | Morris et al. |
| 5,242,839 A | 9/1993 | Oh et al. |
| 5,256,582 A | 10/1993 | Mosher et al. |
| 5,262,335 A | 11/1993 | Streit et al. |
| 5,300,445 A | 4/1994 | Oku |
| 5,324,671 A | 6/1994 | Bayraktaroglu |
| 5,324,682 A | 6/1994 | Tserng |
| 5,388,068 A | 2/1995 | Ghoshal et al. |
| 5,445,985 A | 8/1995 | Calviello et al. |
| 5,455,451 A | 10/1995 | Usagawa et al. |

OTHER PUBLICATIONS

Streit, D.C. et al., "Effect of molecular–beam epitaxy growth conditions on GaAs–AlGaAs heterojunction bipolar transistor performance: Beryllium incoporation and device reliability", *J.Vac.Sci. Tech.* B, 10(2) (1992) pp. 853–855.

Streit, D.C. et al "High–Reliability GaAs–AlGaAs HBT's by MBE with Be Base Doping and InGaAs Emitter Contacts", *IEEE Electron Device Letters* 12:9 (1991) pp. 471–473.

(List continued on next page.)

*Primary Examiner*—Tuan H. Nguyen
(74) *Attorney, Agent, or Firm*—Harness, Dickey & Pierce, P.L.C.

(57) ABSTRACT

A method of selective molecular beam epitaxy for fabricating monolithically integrated circuit devices on a common substrate including combinations of PIN diode devices, HBT devices, HEMT devices and MESFET devices. The method includes depositing a profile layer of one of the devices on an appropriate substrate and then depositing a first dielectric layer over the profile layer. The profile layer and the dielectric layer are then etched to define a first device profile. A second profile layer for defining a second device is then deposited over the exposed substrate. The second profile is then selectively etched to define a second device profile. This process can be extended to more than two different device types monolithically integrated on a common substrate as long as the first developed devices are robust enough to handle the temperature cycling involved with developing the subsequent devices.

15 Claims, 10 Drawing Sheets

OTHER PUBLICATIONS

Kobayashi, K. W. et al. "Integrated Complementary HBT Microwave Push–Pull and Darlington Amplifiers with p–n–p Active Loads", *IEEE J. of Solid–State Circuits*, 28:10 (1993) pp. 1011–1017.

Streit, D.C. et al., "Selective molecular–beam epitaxy for integrated npn/pnp heterojunction bipolar transistor applications", *J.Vac.Sci Tech.* B 10(2) (1992) pp. 1020–1022.

Umemoto, D.K. et al. "Integrated npn/pnp GaAs/AlGaAs HBTs Grown by Selective MBE", *Electronics Letters*, 27:17 (1991) pp. 1517–1518.

Plumton, D.L. et al. Process Interation of Isolated Emitter Transistors with Common Emitter Heterojunction Bipolar Transistor Circuits, *IEEE* (1989) pp 15.3.1–15.3.4.

Plumton, D. L. et al. "Planar AlGaAs/GaAs HBT Fabricated by MOCVD Overgrowth with a Grown Base", *IEEE Transactions on Electron Devices*, 37:5 (1990) pp. 1187–1192.

Cheskis, D. et al. "Co–Integration of GaAlAs/GaAs HBTs and GaAs FETs with a Simple,Manufacturable Process", *IEEE (1992)* pp. 4.6.1–4.6.4.

Palevski, A. et al. "Regrown ohmic contacts to thin GaAs layers and two–dimensional electron gas", *American Institute of Physics* (1990) pp. 171–173.

Cho, A.Y. et al. "GaaS planar technology by molecular beam epitaxy (MBE)", *Journal of Applied Physics*, 46:2 (1975) pp. 783–785.

Itakura, K. "A GaAs Bi–FET Technology for Large Scale Integration", *IEEE*(1989) pp. 15.2.1–15.2.4.

Scott, E.G. et al. "Factors affecting the growth of an integrated $Ga_{1-x}In_xAs$/InP PIN–FET by molecular beam epitaxy", *J.Vac.Sci. Technol.*B3(3) (1985) pp. 816–819.

Miura, S. et al. "A Monolithically Integrated AlGaAs/GaAs p–i–n/FET Photoreceiver by MOCVD", *IEEE Electron Device Letters*, 4:10 (1983) pp. 375–376.

Shibata, J. et al. "Monolithic integration of an InGaAsP/InP laser diode with heterojunction bipolar transistors", *Appl. Phys. Lett.*, 45:3 (1984) pp. 191–193.

Berger, P.R. et al. "Monolithic integration of GaAs and $In_{0.2}Ga_{0.8}As$ lasers by molecular beam epitaxy on GaAs", *Appl. Phys. Lett.* 58:23 (1991) pp. 2698–2700.

Zebda, Y. et al. "Monolithically Integrated InP–Based Front–End Photoreceivers", *IEEE Transactions on Electron Devices* 38:6 (1991) pp. 1324–1333.

Yang, J.Y. et al. "GaAs BIJFET Technology for Linear Circuits", *GaAs IC Symposium*, pp. 341–344.

Hong, W.P. et al. "Monolithically Integrated $In_{0.52}Al_{0.48}As$/$In_{0.53}Ga_{0.47}As$ MSM–HEMT Receiver Grown by OMCVD Patterned InP Substrates", *IEEE* (1989) 733–736.

Song, Jong–In et al. "Self–Aligned InAlAs/InGaAs Heterojunction Bipolar Transistor with A Buried Subcollector Growy by Selective Epitaxy", *IEEE Electron Device Letters* (1994) pp. 123–125.

Frei, M.R. et al. "Selective growth of InGaAs/InP heterojunction bipolar transistors with a buried subcollect or", *Appl. Phys. Lett.*61:10 (1992) pp. 1193–1195.

Stanchina, W.E. et al. "Monolithic Fabrication of NPN and PNP AllnAs/GaInAs HBTs", pp. 569–571.

Choquette, K.D. et al. "Molecular bean epitaxial regrowth on in situ plasma–etched AIAs/AIGaAs heterostructures", *Appl. Phys. Lett.*, 60:14 (1992) pp. 1738–1740.

Ikossi–Anastasiou, K. et al. "Interface states in regrown GaAs p–n junctions by selective molecular beam epitaxy", *Appl. Phys. Lett.* 61:3 (1992) pp. 297–299.

Slater, D.B. et al. "Monolithic Integration of Complementary HBT's by Selective MOVPE", *IEEE Electron Device Letters*, 11:4 (1990) pp. 146–148.

Balynas, Y. et al. "Selective Area Eptaxy and Growth Over Patterned Substrates by Chemical Beam Epitaxy", *Electronics Letters*, 27:1 (1991) pp. 3–5.

Beam, E.A. et al. "A Cantilever shadow mask technique for reduced area molecular beam epitaxial growth", *Appl. Phys. Lett.*, 58:2 (1991) pp. 152–154.

Kuech, T.F. et al. "Selective epitaxy in the conventional metalorganic vapor phase epitaxy of GaAs", *Appl. Phys. Lett.*, 54:10 (1989) pp. 910–912.

Kobayashi, K.W. et al. "Complementary HBT Push–Pull Amplifier by Selective MBE", *IEEE Microwave and Guided Wave Letters*, 2:4 (1992) pp. 148–150.

Kukutsu, N. et al. "Monolithic Integration of Pseudomorphic Power and Low–Noise HEMTs", *Electronics Letters*, 25:9 (1989) pp. 583–584.

Palevski, A. et al. "Selectively Regrown Contacts to Field–Effect Transistors with Two–Dimensional Electron–Gas Channels", *IEEE Electron Device Letters*, 11:11 (1990) pp. 535–537.

Kawashima, M. et al. "Growth of GaAs on Preferentially Etched GaAs Surfaces by Migration–Enhanced Epitaxy", 27:4 (1988) pp. L483–L486.

Stanchina, W.E. et al. "InP Based Technology for Monolithic Multiple–Device, Multiple Function ICs", *GOMAC Digest of Papers* (1991) pp. 385–388.

Kawanishi, H. et al. "In situ patterning and overgrowth for the formation of buried GaAs/AlGaAs single quantum–well structures," *App. Phys. Lett.*, 60:3 (1992) pp. 365–367.

Berger, P. R., et al. "GaAs quantum well laser and heterojunction bipolar transistor integration using molecular beam epitaxial regrowth," *Appl. Phys. Lett.* 59:22 (1991) pp. 2826–2828.

* cited by examiner

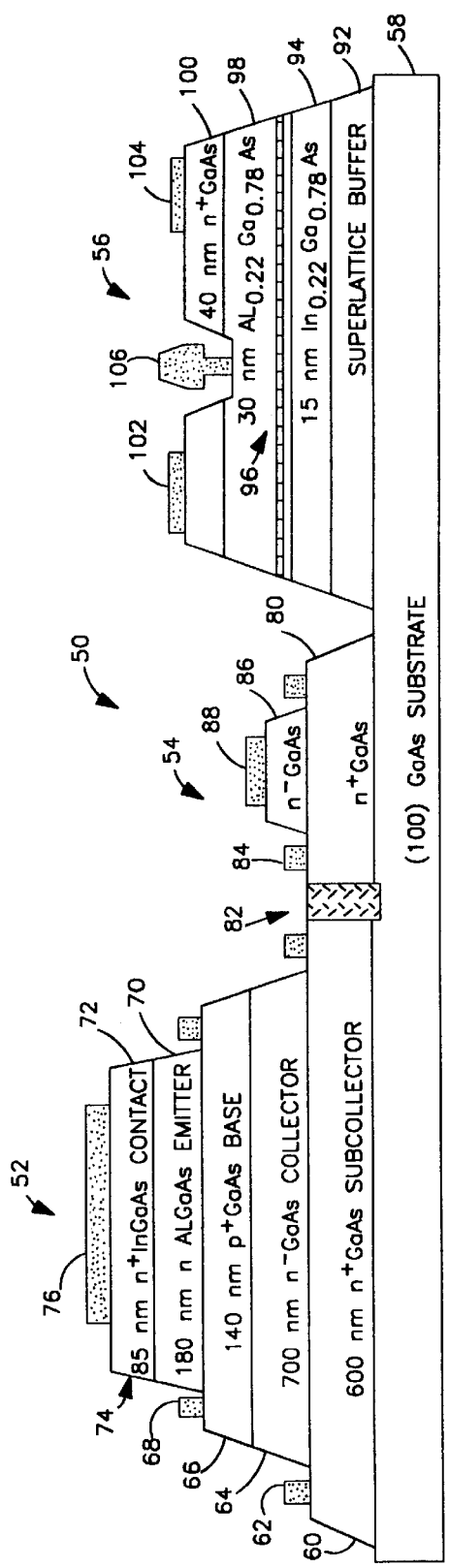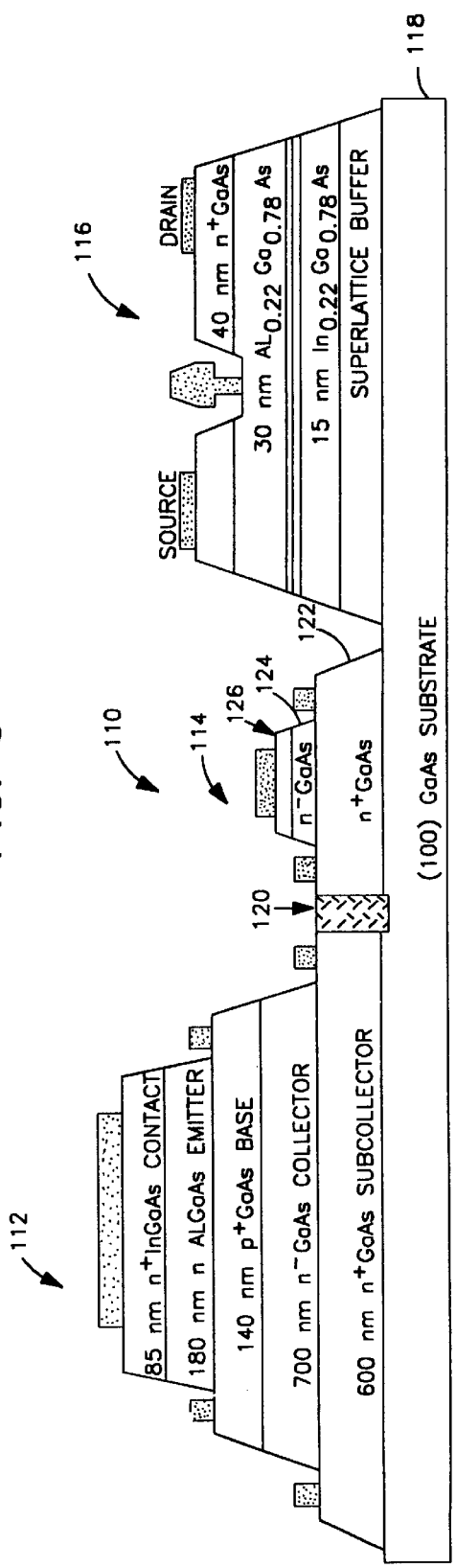

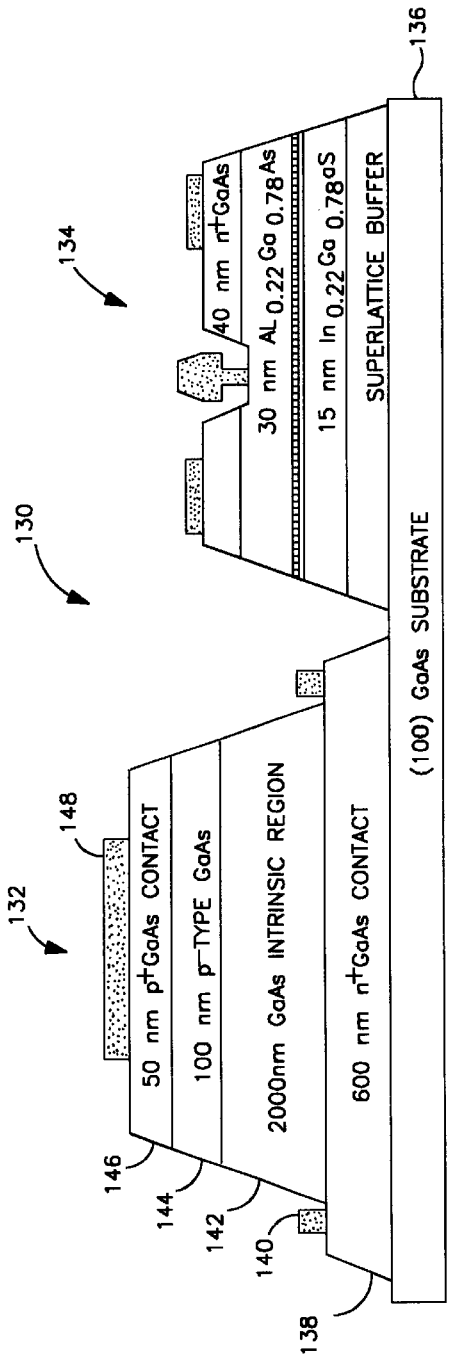
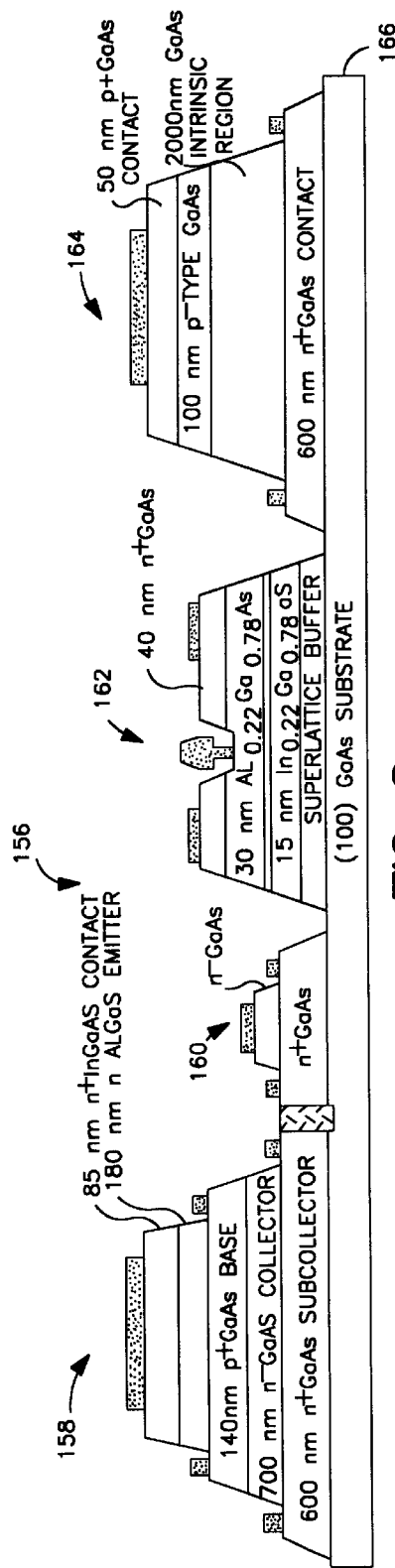
FIG. 5
FIG. 6

METHOD OF FABRICATING MONOLITHIC MULTIFUNCTION INTEGRATED CIRCUIT DEVICES

This is a division of U.S. patent application Ser. No. 08/333,538, filed Nov. 2, 1994 entitled "Method of Fabricating Monolithic Multifunction Integrated Circuit Devices", now abandoned.

BACKGROUND OF THE INVENTION

1. Field of the Invention

This invention relates generally to a method of fabricating monolithic multifunction integrated circuits and the resulting integrated circuit and, more particularly, to a method of selective molecular beam epitaxy for fabricating different semiconductor device types in an integrated circuit format on a common substrate and the resulting integrated circuit.

2. Discussion of the Related Art

It is known that the integration of multifunction circuit devices, i.e., circuits that include more than one device type, on a common substrate, in certain applications, such as microwave, millimeter wave, and optoelectronic applications, increases the performance of the integrated circuits incorporating the integrated devices over circuits that separately integrate the different device types. For example, by monolithically integrating a high electron mobility transistor (HEMT) and a heterojunction bipolar transistor (HBT), both well known devices in the art, the combination of the low-noise advantages of the HEMT and the high power, high linearity advantages of the HBT can provide microwave circuits with lower noise and higher power than could be realized by separately fabricating the HEMT and HBT in known baseline fabrication techniques and combining the devices in hybrid circuits.

Many other circuits could benefit from the integration of multifunction circuit devices. PIN diode limiters are currently used to shield low-noise HEMTs in high-energy environments because HEMTs have a tendency to burn out from the high energy. However, because PIN diode limiters and HEMTs are currently separately integrated in hybrid circuits, there are additional transition losses that if the PIN diode limiter and the HEMT were monolithically integrated on the same substrate, such losses would be essentially eliminated. Additionally, digital function advantages of HBTs can be combined with microwave function advantages of HEMTs, so that for many applications, such as transistor-transistor logic (TTL) controlled phase shifters, HBTs and HEMTs can be generated with increased performance. In another example, HEMT amplifiers can be stabilized using HBT active regulation for improved reliability and stability. Essentially, any circuit application requiring multiple high performance semiconductor devices can be more effectively realized using monolithic integration rather than hybrid integration.

Current semiconductor fabrication techniques are limited in the ability to fabricate more than one device type on a common substrate. Different techniques for integrating semiconductor devices having different functions are known in the art. For example, the integration of PIN diodes and metal semiconductor field effect transistors (MESFETS) or HEMTs has been accomplished using a single molecular beam epitaxial growth layer with certain interconnect schemes. See for example S.

Miura et al., "A Monolithically Integrated AlGaAs/GaAs p-i-n/FET photoreceiver by MOCVD," IEEE Electron Dev. Lett., Vol. 4, pp. 375–376, 1983. Additionally, PIN diodes and MESFETs or HEMTs have been integrated using a molecular beam epitaxy (MBE) regrowth process. See Y. Zebda et al., "Monolithically Integrated InP-Based Front-End Photoreceivers," IEEE Trans. Elect. Dev., Vol. 38, pp. 1324–1333, 1991. Further, the integration of lasers and HBTs has been accomplished using buried epitaxial layers and MBE regrowth. See J. Shivata et al., "Monolithic Integration of InGaAsP/InGaAsP/InP Laser Diode With Heterojunction Bipolar Transistors," Appl. Phys. Lett., Vol. 45, pp. 191–193, 1984 and P. R. Berger et al., "GaAs Quantum Well Laser and Heterojunction Bipolar Transistor Integration Using Molecular Beam Epitaxial Regrowth," Appl. Phys. Lett., Vol. 59, pp. 2826–2828, 1991. GaAs-based Bi-FET technology has been reported using a single epitaxial growth with the FET merged into the HBT collector or emitter, or using AlGaAs overgrowth combined with beryllium implantation. See K. Itakura et al., "A GaAs Bi-FET Technology For Large Scale Integration," IEDM Technical Digest, pp. 389–392, 1989; D. Cheskis et al., "Cointegration of GaAlAs/GaAs HBTs and GaAs FETs With A Simple Manufacturable Processes," IEDM Technical Digest, pp. 91–94, 1992 and J. Y. Yang et al., "GaAs BIJFET Technology For Linear Circuits," Proceeding IEEE GaAs IC Symposium, pp. 341–344, 1989. In each of these examples, the FET performance is compromised due to the limitations of the profile and the process. InP based HEMT-HBT integration has also been attempted using a single epitaxial growth, but successful operation of both device types has not yet been reported. See W.E. Stanchina et al., "InP-Based Technology for Monolithic Multiple-Device, Multiple-Function ICs," GOMAC Digest of Papers, pp. 385–388, 1991.

U.S. Pat. No. 5,262,335 issued to Streit et al., assigned to the assignee of the instant application, and herein incorporated by reference, discloses a method to produce complimentary heterojunction bipolar transistors in which a first NPN or PNP profile is grown by selective molecular beam epitaxy on a substrate. A silicon nitride layer is then deposited over the profile, and the silicon nitride layer and the profile are selectively patterned and etched to define an NPN or PNP heterojunction bipolar transistor. The opposite NPN or PNP profile is then deposited on the substrate adjacent to the original profile such that the remaining portion of the silicon nitride layer protects the original profile from the growth of the second profile. The devices are patterned and etched such that the silicon nitride layers are removed and adjacent complimentary NPN/PNP profiles remain on the substrate.

Fabrication processes in the prior art are limited in their ability to produce monolithic integrated devices. It is an object of the present invention to provide a selective molecular beam epitaxy fabrication method that enables a significant number of integrated devices to be monolithically integrated on a common substrate.

SUMMARY OF THE INVENTION

In accordance with the teachings of the present invention, a method is disclosed for fabricating monolithic multifunction integrated circuit devices. In one method of the invention, an HBT or PIN diode device is monolithically integrated on a common substrate with an HEMT or MESFET device. The process involves first growing by selective molecular beam epitaxy an HBT or PIN diode profile layer on a GaAs or InP substrate. A first silicon nitride layer, or other appropriate dielectric layer, is then deposited over the HBT or PIN diode profile layer. The first silicon nitride layer and the HBT or PIN diode profile layer are patterned and etched such that an HBT or PIN diode device layer covered by a silicon nitride layer remains adjacent to an area where the substrate is exposed. An HEMT or MESFET profile layer is then grown over the substrate such that single crystalline HEMT or MESFET material is deposited on the substrate and polycrystalline HEMT or MESFET material is deposited on the remaining silicon nitride layer. The polycrystalline HEMT or MESFET material and the remaining silicon nitride layer are etched away so that an HBT device profile or PIN diode device profile and an MESFET device profile or an HEMT device profile remain on a common substrate.

This process can also be extended to more than two functional devices on a common substrate. For example, to generate a PIN diode-HBT-HEMT monolithically integrated device, a substrate is provided on which is deposited a PIN diode profile layer. A first silicon nitride layer is deposited over the PIN diode profile layer, and the silicon nitride layer and the PIN profile layer are patterned and etched to define a PIN diode device profile covered with a silicon nitride layer. An HBT profile layer is then grown on the substrate such that single crystalline HBT material is deposited on the exposed substrate and polycrystalline HBT material is deposited on the remaining portion of the first silicon nitride layer. The polycrystalline HBT material and the remaining first silicon nitride layer are etched away, and a second silicon nitride layer is deposited. The second silicon nitride layer and the HBT single crystalline material are then patterned and etched to define an HBT device profile on the substrate. An HEMT profile layer is then grown on the substrate such that single crystalline HEMT material is deposited on the substrate and polycrystalline HEMT material is deposited on the remaining portion of the second silicon nitride layer. The polycrystalline HEMT material and the remaining second silicon nitride layer are then etched away such that an integrated PIN diode-HBT-HEMT device remains.

Once all of the device profiles are grown on the common substrate, subsequent device and circuit processing is performed to further define and interconnect the devices.

Additional objects, advantages, and features of the present invention will become apparent from the following description and appended claims, taken in conjunction with the accompanying drawings.

BRIEF DESCRIPTION OF THE DRAWINGS

FIG. 3 shows a side view of a monolithically integrated HBT—Schottky diode—HEMT device that has been fabricated according to a method of the present invention;

FIG. 4 shows a side view of a monolithically integrated HBT-PIN diode-HEMT device that has been fabricated according to a method of the present invention;

FIG. 5 shows a side view of a monolithically integrated PIN diode-HEMT device that has been fabricated according to a method of the present invention;

FIG. 6 shows a side view of a monolithically integrated HBT-Schottky diode-HEMT-PIN diode device that has been fabricated by a method of the present invention;

DETAILED DESCRIPTION OF THE PREFERRED EMBODIMENTS

The following discussion of the preferred embodiments concerning methods of generating monolithically integrated circuit devices, and the resulting integrated circuits, is merely exemplary in nature and is in no way intended to limit the invention or its applications or uses.

First turning to FIGS. 1(a)–1(d), a series of side views of a monolithically integrated semiconductor structure 10 is shown as the structure 10 is being fabricated by steps in accordance with forming a monolithically integrated circuit device by a preferred embodiment of the present invention. The method of fabricating the structure 10 is applicable to form many monolithically integrated devices including, but not limited to, monolithically integrated HEMT-HBT, HEMT-PIN diode, MESFET-HBT or MESFET-PIN diode devices. Monolithically integrated devices fabricated by the process as will be discussed are formed on a common substrate 12. In the embodiment shown, the substrate 12 is either gallium arsenide (GaAs) or indium phosphide (InP), however, other substrates may be applicable. The process for fabricating the different semiconductor layers is performed by a selective molecular beam epitaxy (MBE) process, well understood by those skilled in the art.

Figure 1A:
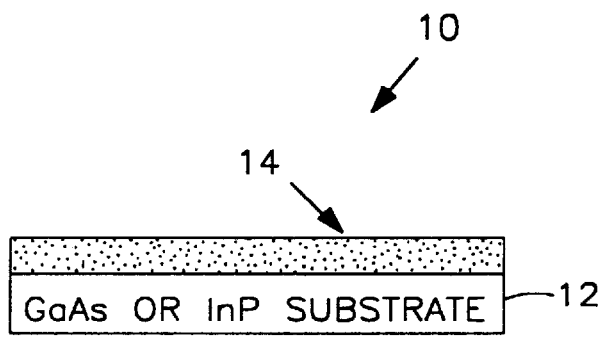
FIGS. 1(a)–1(d) show side views of a developing structure for fabricating an HEMT-HBT, HEMT-PIN diode, MESFET-HBT, or MESFET-PIN diode integrated circuit device according to a preferred embodiment of the present invention.

An HBT profile layer 14 is first grown on the substrate 12 by the MBE process as shown in FIG. 1(a). The HBT profile layer 14 is grown when fabricating an integrated HEMT-HBT or MESFET-HBT device. When fabricating an HEMT-diode or MESFET diode device, the profile layer 14 would be a diode profile layer. The profile layer 14 would include all of those semiconductor layers that make up an HBT or diode device. The diode profile could be any applicable diode profile, including, but not limited to, PIN diodes, schottky diodes, triodes, etc. After the layer 14 has been grown, a silicon nitride ($Si_3N_4$) layer is deposited on the structure 10 by, for example, a plasma enhanced chemical vapor deposition process, well understood to those skilled in the art. It is noted that silicon nitride is used by way of a non-limiting example as other dielectric layers, such as silicon dioxide, may be equally applicable. The silicon nitride layer 16 will be used as a blocking layer to shield the HBT device from the growth of HEMT or MESFET profile layers that are to be fabricated, as will become apparent from the discussion below.

After the silicon nitride layer 1 has been deposited on the profile layer 14, a resist layer (not shown) is then deposited on the silicon nitride layer 16. A mask (not shown) is then used to pattern the resist layer, and thus the silicon nitride layer 16, into a pattern that will define either the diode device or the HBT device. The resist layer is exposed to radiation through the mask, and then is developed by an appropriate solvent such that the unmasked portions of the resist layer are dissolved and removed. An etchant solution is then applied to the exposed portions of the silicon nitride layer 16 to remove the silicon nitride in the areas which coincide with the removed regions of the resist layer in order to expose the profile layer 14 at these regions. The exposed regions of the profile layer 14 are then etched by an appropriate anisotropic etchant to expose the substrate 12.

Figure 1B:
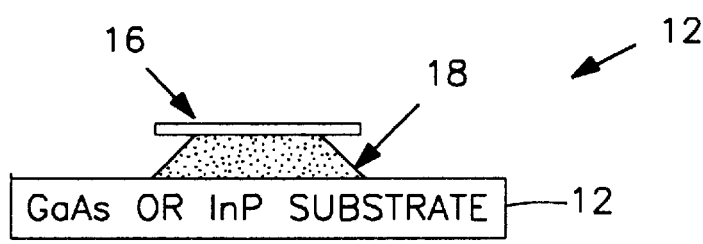

FIG. 1(b) shows the structure 10 after the exposed regions of the layer 14 have been etched away. The remaining profile layer 14 defines an HBT device layer 18, as shown. A portion of the silicon nitride layer 16 remains over the device layer 18. The anisotropic etching step produces a retrograde profile that causes overhang areas of the remaining silicon nitride layer 16 to extend beyond a top surface of the device layer 18. This provides a clean separation between the device layer 18 and subsequent device profile layers, as will become apparent from the discussion below. The structure 10 is then removed from the MBE chamber (not shown), cleaned, and then reintroduced into the MBE system. The remaining silicon nitride layer 16 is densified during the normal de-gas in the MBE chamber as is well understood to those skilled in the art.

Figure 1C:
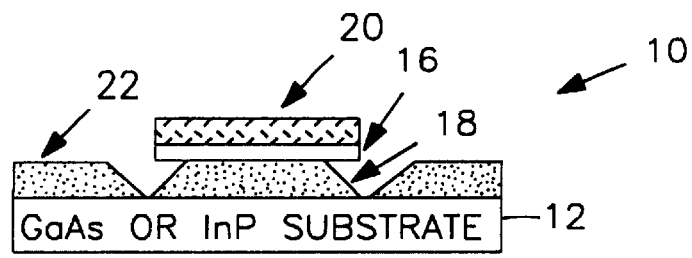
Figure 1D:
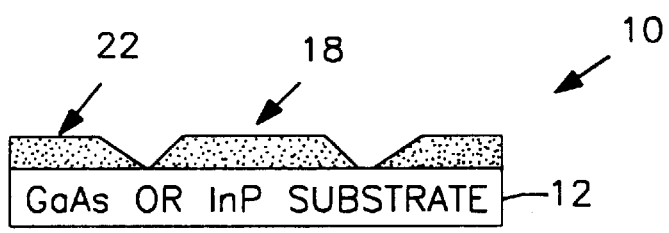

A pseudomorphic InGaAs-GaAs HEMT profile is then grown over the structure 10 by a known HEMT MBE growth procedure. It is also within the scope of the present invention to grow an MESFET profile at this place in the processing of the structure 10 instead of the HEMT profile. As shown in FIG. 1(c), the HEMT material that is deposited on the remaining silicon nitride layer 16 forms a polycrystalline HEMT profile layer 20 because the HEMT material is not lattice matched with the silicon nitride layer 16. The HEMT material that is deposited on the cleaned substrate 12 forms a single crystalline HEMT profile layer 22 because the HEMT material is lattice matched to the cleaned surface of the substrate 12. The single crystalline profile layer 22 forms the HEMT device. The polycrystalline HEMT layer 20 is removed by a wet etch process and the remaining silicon nitride layer 16 is removed using a dry etch process, both known processes in the art. Portions of the single crystalline HEMT profile layer 22 can be removed by an appropriate masking and etching step so as to further define the device geometry of the HEMT device. The monolithically integrated structure 10, as shown in FIG. 1(d), is then ready for device and circuit processing.

By the above process, the prior art HBT beryllium base dopant interstitial diffusion procedure associated with non-optimized MBE growth has been eliminated. This results in P-type profiles robust enough to withstand the additional temperature cycling associated with the HEMT growth, and is one key to the success of this selective MBE technique. In order for the HBT or diode profile to survive the HEMT temperature cycle during formation of the HEMT device, not only must the base layer of the HBT be stable, but also other layers in the HBT or diode profile must be stable. This includes an $n=2\times10^{19}$ contact layer and an $n=5\times10^{17}$ $cm^{-3}$ $Al_{0.3}Ga_{0.7}As$ emitter layer.

Figure 2A:
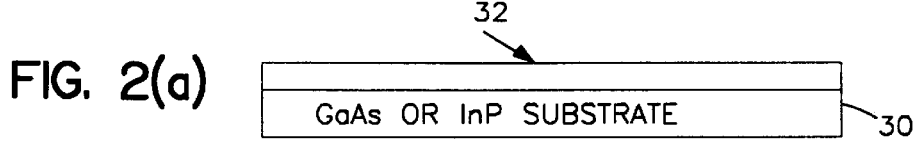
FIGS. 2(a)–2(g) show side views of a developing structure for fabricating an HEMT-HBT-PIN diode or MESFET-HBT-PIN diode integrated circuit device according to a preferred embodiment of the present invention.
Figure 2B:
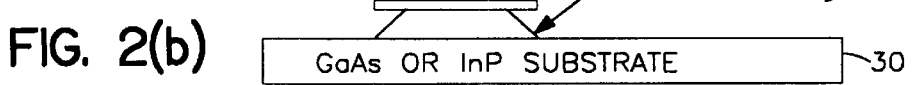
Figure 2C:
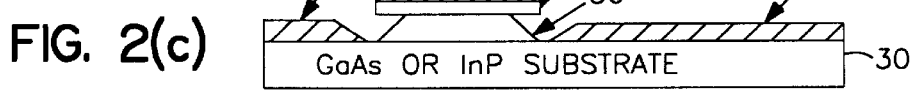
Figure 2D:
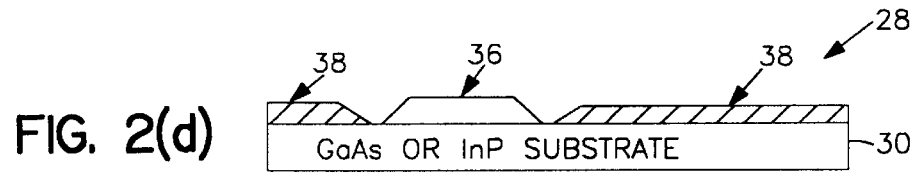

The techniques discussed above with reference to FIG. 1(a)–1(d) can be extended to a process for forming other multiple monolithic integrated devices. For example, FIGS. 2(a)–2(g) show sequential fabrication steps of a monolithically integrated semiconductor structure 28 that generates a monolithically integrated HEMT-HBT-diode device. The device is formed on a GaAs or InP substrate 30, as with the structure 10 above. As shown in FIG. 2(a), a diode profile layer 32 is grown on the substrate 30. A first silicon nitride layer 34 is deposited, masked and etched, in the manner as discussed above, to form a diode device layer 36 as shown in FIG. 2(b). A remaining portion of the silicon nitride layer 34 covers the device layer 36. Note that overhang areas of the silicon nitride layer 34 extend beyond the device layer 36 as a result of the retrograde profile produced by the anisotropic etch that formed the device layer 36. An HBT profile is then grown over the structure 28 such that HBT material deposited on the substrate 30 forms a single crystalline HBT profile layer 38, and HBT material deposited on the remaining silicon nitride layer 34 forms a polycrystalline HBT profile layer 40, as shown in FIG. 2(c). FIG. 2(d) shows the developing structure 28 after the silicon nitride layer 34 and the polycrystalline HBT profile layer 40 have been dissolved by an appropriate wet etch and dry etch, respectively.

Figure 2E:
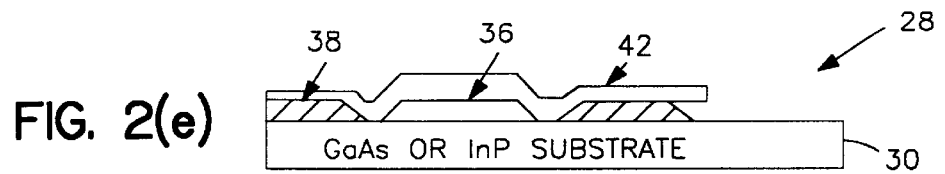
Figure 2F:
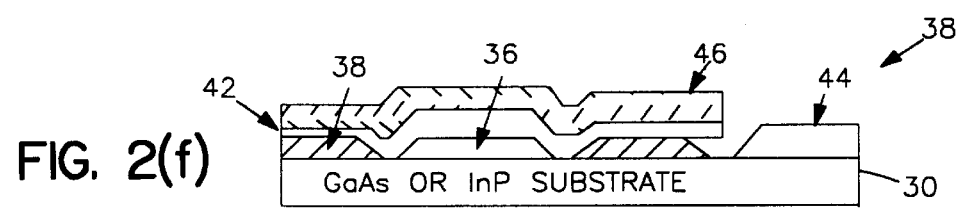
Figure 2G:
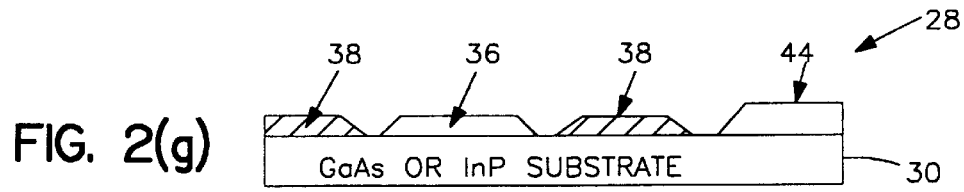

A second silicon nitride layer 42 is then deposited over the structure 28. The silicon nitride layer 42 is then patterned and etched by an appropriate resist layer and mask layer (not shown), in the manner as discussed above, to expose a region on the substrate 30 that will accept an HEMT profile, as shown in FIG. 2(e). HEMT material is then grown by the selective MBE process on the structure 28 such that a single crystalline HEMT layer 44 is deposited on the substrate 30, and a polycrystalline HEMT layer 46 is deposited on the remaining second silicon nitride layer 42, as shown in FIG. 2(f). As with the process with reference to FIGS. 1(a)–1(d), it is within the scope of the present invention to deposit an MESFET profile instead of the HEMT profile. An appropriate wet etch and dry etch selectively remove the polycrystalline layer 46 and the remaining silicon nitride layer 42, respectively, to expose and define an integrated HEMT-HBT-diode device, as shown in FIG. 2(g).

FIGS. 1(a)–1(d) show the processing steps necessary to fabricate dual monolithically integrated devices in which the first deposited device was robust enough to withstand the temperature cycling involved with fabricating the second deposited device, taking into consideration that the second deposited device is protected by the silicon nitride layer 16. FIGS. 2(a)–2(g) show the processing steps for fabricating three monolithically integrated devices in which the first deposited device is robust enough to withstand the temperature cycling involved with fabricating the second and third deposited devices, and the second deposited device is robust enough to withstand the temperature cycling involved with fabricating the third deposited device, taking into consideration that the second and third deposited devices are protected by the silicon nitride layer 42. This process can be extended to other semiconductor devices that satisfy this criteria, including extending the process to more than three monolithically integrated devices. For example, the process can be extended to fabricating a monolithically integrated HBT-diode device. The above-described process with reference to FIG. 2 can also be extended to a monolithically integrated MESFET-HBT-diode device where an MESFET profile is grown instead of the HEMT profile. Further, after the fabrication steps involved in the selective molecular epitaxy process that forms the device profiles as shown in FIGS. 1(d) and 2(g), other fabrication steps, known in the art, can be incorporated to provide other device types. For example, an ion implantation isolation step can be performed to separate portions of the collector layers of the HBT device to form diodes, such as Schottky diodes and PIN diodes. Also, other devices can be deposited such as a superconducting-insulator-superconducting detector after the selective molecular beam epitaxy steps.

FIGS. 3–8 show profile side views of six different monolithically integrated circuit devices after final device and circuit processing steps that could be fabricated by the selective MBE process according to the invention as discussed above. It will be understood that the different device layers and profiles discussed below for specific devices is merely by way of a non-limiting example in that the device profiles for a particular device could be any applicable profile for that device that is known in the art. Because the different device layers and contacts are known in the art, the description given below for these layers is merely cursory. It is also noted that because the various devices have been formed by molecular beam epitaxy, the bottom layer of each device forms an epitaxial bond with the substrate.

FIG. 3 shows a monolithically integrated device 50 including an HBT 52, a THz Schottky diode 54, and an HEMT 56 that could have been fabricated by the process as discussed above with reference to FIG. 1. Each of the different layers of the HBT 52, the Schottky diode 54 and the HEMT 56, are shown. As mentioned above, the HBT device layer 18 would include all of the layers of the HBT 52, and the HEMT profile layer 22 would include all of the layers of the HEMT 56. However, the HBT 52 has been further defined and processed more than the device layer 18, and the HEMT 56 has been further defined and processed more than the profile layer 22. The substrate 30 is shown as a GaAs substrate 58.

The HBT 52 includes a heavily doped n-type GaAs subcollector layer 60 grown on the substrate 58 to a thickness of about 600 nm. Two ohmic collector contacts 62 are deposited and defined on the subcollector layer 60. A lightly doped n-type GaAs collector layer 64 is grown on the subcollector layer 60 to a thickness of about 700 nm. A heavily doped p-type GaAs base layer 66 is grown on the collector layer 64 to a thickness of about 140 nm. An ohmic base contact 68 is deposited and defined on the base layer 66. An n-type AlGaAs emitter layer 70 is grown on the base layer 66 to a thickness of about 180 nm. A heavily doped n-type InGaAs emitter contact layer 72 is grown on the emitter layer 70 to a thickness of about 85 nm. The combination of the emitter layer 70 and the emitter contact layer 72 form an emitter mesa 74. An ohmic emitter contact 76 is deposited and defined on the emitter contact layer 72. The different processing steps that generate each of the contacts and the collector, base and emitter mesas of the HBT 52 as shown in FIG. 3 are well understood in the art.

The layers that make up the Schottky diode 54 are deposited simultaneously with the collector layers 60 and 64 of the HBT 52 andx he diode 54 is subsequently separated from the HBT 52. Particularly, a heavily doped n-type GaAs diode layer 80 of the diode 54 is grown at the same time the subcollector layer 60 of the HBT 52 is grown so that the layer 80 and the subcollector layer 60 have the same thickness and composition. The subcollector layer 60 and the diode layer 80 are separated by an implant isolation region 82 formed by an ion implantation step of a suitable ion, such as oxygen, well known to those skilled in the art. A set of ohmic contacts 84 are deposited and defined on the diode layer 80. A lightly doped n-type GaAs diode layer 86 is formed on the diode layer 80. The diode layer 86 is formed simultaneously with the collector layer 64 of the HBT 52, and as such, is the same thickness and composition as the layer 64. A top ohmic contact 88 is deposited and defined on the diode layer 86. The diode layer 86 is separated from the collector layer 64 and defined by any suitable patterning process well known to those skilled in the art. Separation of the Schottky diode 54 from the collector layers of the HBT 52 provide a convenient way of providing another monolithically integrated device after the molecular beam epitaxy steps that is useful for certain applications. Etching steps are used to remove the profile layers that would have been above the diode layers 80 and 86 after the MBE steps.

The HEMT 56 has the different device layers as the HEMT profile layer 22 of FIG. 1. Particularly, the HEMT 56 includes a superlattice buffer layer 92 grown on the substrate 52. An $In_{0.22}Ga_{0.78}As$ channel layer 94 is grown on the superlattice buffer layer 92 to a thickness of about 15 nm. A silicon planar doped layer 96 is deposited on the channel layer 94 to define the channel layer 94, as is well understood in the art. An $Al_{0.22}Ga_{0.78}As$ door layer 98 is grown on the planar doped layer 96 to a thickness of about 30 nm. A heavily doped n-type GaAs contact layer 100 is grown on the donor layer 98 to a thickness of about 40 nm. A source terminal 102 and a drain terminal 104 are deposited and defined by an electron beam lithography process on the contact layer 100 as shown. The contact layer 100 is etched to expose the donor layer 98, and a T-gate drain terminal 106 is deposited and etched on the donor layer 98 as shown. As discussed above, it is within the scope of the invention to replace the HEMT 56 with an MESFET.

FIG. 4 shows a side profile view of a monolithically integrated device 110 that could also have been fabricated by the process as discussed above with reference to FIG. 1. The integrated device 110 includes an HBT 112, a PIN diode 114 and an HEMT 116 formed on a common substrate 118. The HBT 112 is the same as the HBT 52 and the HEMT 116 is the same as the HEMT 56, discussed above, and thus, the different layers of the HBT 112 and the HEMT 116 will not be discussed. As above, the HEMT 116 could have been replaced with an MESFET. The PIN diode 114 is isolated from the HBT 112 by an implant isolation region 120 in the same manner that the Schottky diode 54 was isolated from the HBT 52 above. The PIN diode 114 includes a heavily doped n-type GaAs diode layer 122 and a lightly doped n-type GaAs diode layer 124 that were grown at the same time as the subcollector layer and the collector layer of the HBT 112, respectively, and therefore have the same thickness and composition as these layers. The layer 124 acts as the intrinsic layer in the PIN structure. A heavily doped p-type GaAs layer 126 is grown on the lightly doped n-type GaAs layer 124 to provide the PIN diode structure. The layer 126 was grown at the same time as the base layer of the HBT 112. However, the layer 126 has been etched to reduce its thickness to be less than the base layer of the HBT 112. Diode contacts are deposited and defined in connection with the layer 122 and the layer 126 as shown. As with the Schottky diode 54 above, the PIN diode 114 has been separated from the HBT 112 in a convenient manner so as to provide an additional integrated device than the two device circuit as discussed above with reference to FIG. 1.

FIG. 5 shows a side profile view of a monolithically integrated device 130 that could also have been fabricated by the process as discussed above with reference to FIG. 1. The integrated device 130 includes a PIN diode 132 and an HEMT 134 formed on a common substrate 136. The HEMT 134 is the same as the HEMT 56, discussed above, and thus, the different layers of the HEMT 134 will not be discussed. The HEMT 134 could also be an MESFET. The PIN diode 132 shows the different device layers of a PIN diode profile. The PIN diode 132 and the HEMT 134 were grown on the substrate 136 as were the device layer 18 and the profile layer 22 on the substrate 12. The PIN diode 132 includes a heavily doped n-type GaAs contact layer 138 grown to a thickness of about 600 nm on the substrate 136. First diode ohmic contacts 140 are deposited and defined on the contact layer 138. A GaAs intrinsic layer 142 is grown on the contact layer 138 to a thickness of about 2000 nm. A p-type GaAs layer 144 is grown on the intrinsic layer 142 to a thickness of about 100 nm. A heavily doped p-type GaAs contact layer 146 is grown on the layer 144 to a thickness of about 50 nm. A second ohmic contact 148 is deposited and defined on the contact layer 146. The PIN diode 132 is significantly different than the PIN diode 114 that was separated from the HBT 112. This is because the PIN diode 114 was conveniently separated as a result of the development of the HBT 112, but the PIN diode 132 was generated by the more detailed selective beam epitaxy process.

FIG. 6 shows a side view of a monolithically integrated device 156 that could have been generated by the steps discussed above with reference to FIGS. 2(a)–2(g). The integrated device 156 includes an HBT 158, a THz Schottky diode 160, an HEMT 162, and a PIN diode 164 on a common substrate 166. Each of these different devices shows the different layers for each particular device, and as such, the HBT 158 could have been formed from the HBT profile layer 38, the HEMT 162 could have been formed from the HEMT profile layer 44 and the PIN diode 164 could have been formed from the PIN diode profile layer 36 of FIG. 2. Because the HBT 158 and Schottky diode 160 combination and the HEMT 162 of FIG. 6 are the same as the HBT 52 and the Schottky diode 54 combination and the HEMT 56 of FIG. 3, the individual layers of the HBT 158, the Schottky diode 160, and the HEMT 162 will not be discussed. Likewise, because the PIN diode 164 of FIG. 6 has the same layer configuration as the PIN diode 132 of FIG. 5, the PIN diode 164 also will not be discussed.

Figure 7:
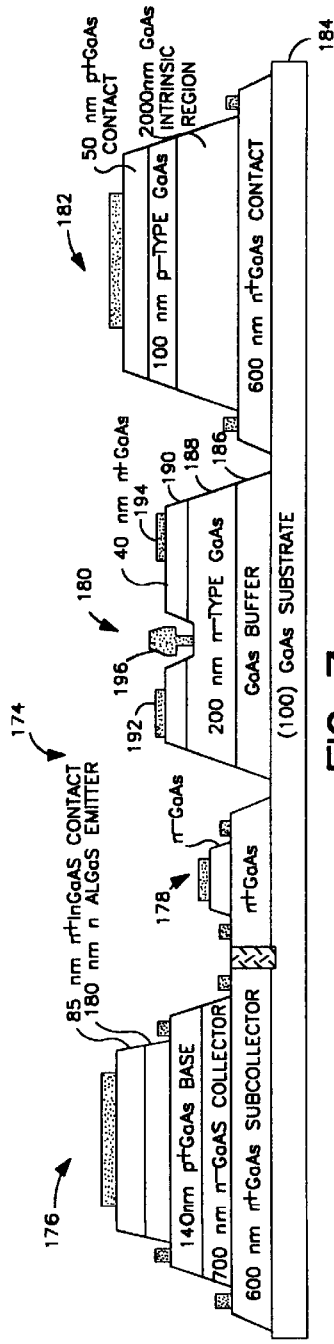
FIG. 7 shows a side view of a monolithically integrated HBT-Schottky diode-MESFET-PIN diode device that has been fabricated by a method of the present invention.

FIG. 7 shows a side view of a monolithically integrated device 174 that could have been generated by the steps discussed above with reference to FIGS. 2(a)–2(g). The integrated device 174 includes an HBT 176, a THz Schottky diode 178, an MESFET 180, and a PIN diode 182 formed on a common substrate 184. The integrated device 174 is the same as the integrated device 156 except that the HEMT 162 has been replaced by the MESFET 180. Therefore, only the specific device profile of the MESFET 180 will be described with the understanding that the other device profiles are the same as those discussed above. The MESFET 180 includes a GaAs buffer layer 186 deposited on the substrate 184. An n-type GaAs layer 188 is grown on the buffer layer 186 to a thickness of approximately 200 nm. A heavily doped n-type GaAs layer 190 is grown on the layer 188 to a thickness of approximately 40 nm. A source terminal 192 and a drain terminal 194 are deposited and defined by an electron beam lithography process on the layer 190. The layer 190 is etched to expose the layer 188, and a T-gate drain terminal 196 is deposited and etched on the layer 188 as shown.

Figure 8:
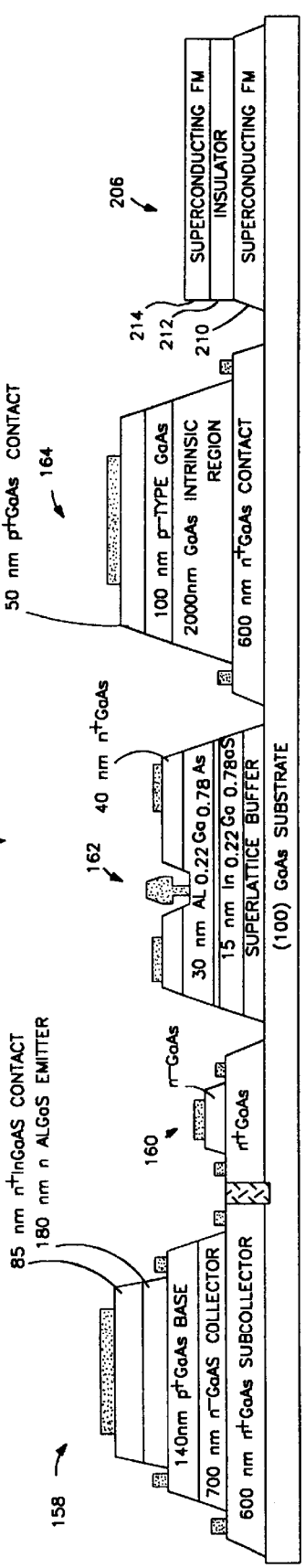
FIG. 8 shows another monolithically integrated HBT-Schottky diode-HEMT-PIN diode device that has been fabricated by a method of the present invention.

The availability of the process techniques to fabricate monolithic multifunction integrated circuits discussed above also allows the incorporation of superconducting films for microwave detection mixing and for digital applications. Superconducting films are typically deposited by sputtering, well known to those skilled in the art, but alternate deposition techniques also are available, such as by evaporation and laser ablation. Therefore, the substrate 166 of the integrated device 156 can also accept a superconducting-insulator-superconducting (SIS) detector 206, as shown in FIG. 8. The SIS detector 206 includes a bottom superconducting film 210 deposited on the substrate 166. An insulator layer 212 is deposited on the superconducting film 210. Another superconducting film layer 214 is deposited on the insulator layer 212. The SIS detector 206 could also have been integrated with an HEMT only, a PIN diode-HEMT integrated device, or a PIN diode-HBT integrated device, depending on its specific application. The SIS detectors 206 can also be replaced by superconducting transmission line or super conducting digital circuits.

Figure 9:
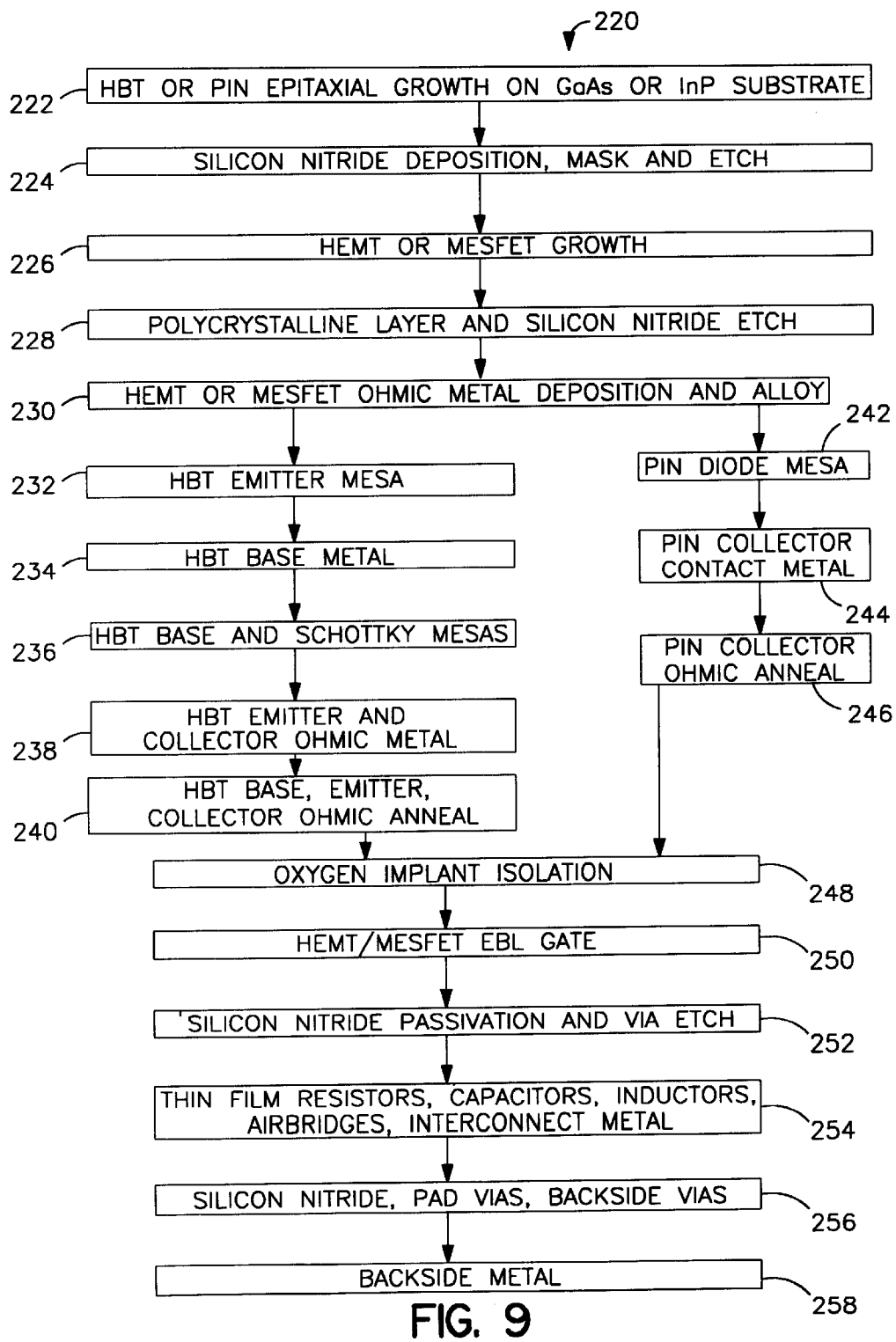
FIG. 9 shows a flow chart diagram of a method for fabricating a monolithically integrated multifunction device according to a method of the present invention.

Merged process technologies have been developed to achieve all of the integrated devices discussed above. FIG. 9 shows a flow chart diagram 220 that provides a step-by-step discussion of the formation of the monolithic integrated circuits 50, 110 and 130 with reference to the discussion above for FIGS. 1(a)–1(d), as well as subsequent device processing steps. Box 222 represents the step of growing the HBT profile layer 14 or a PIN profile layer on the substrate 12. Box 224 represents the formation of the HBT device layer 18 by the deposition, the masking and the etching steps of the silicon nitride layer 16. Box 226 represents the growth of the single crystalline HEMT profile layer 22 and the polycrystalline HEMT profile layer 20 or the growth of a single crystalline MESFET profile layer and a polycrystalline MESFET profile layer. Box 228 represents the etching steps of the polycrystalline layer 20 and the remaining silicon nitride layer 16.

The remaining steps of the flowchart diagram 160 are directed to device and circuit processing steps, such as forming contacts of the individual devices and connections between the devices that taken separately are known in the art. However, because the invention includes developing monolithically integrated circuits, the combination of the individual steps or a sequence of steps in different forms may not be shown in the prior art. Box 230 represents a step of forming the ohmic metal contacts 102 and 104 of the HEMT 56 or the contacts of an MESFET. HEMT or MESFET ohmic metal is evaporated over the developing HEMT or MESFET structure and is rapidly thermally annealed. The evaporated metal is then patterned to form the contacts in a manner well understood to those skilled in the art.

If an HEMT or MESFET is being fabricated integrally with the HBT 52 of FIG. 3 or the HBT of FIG. 4, then the flow diagram 160 moves from the Box 230 to Box 232. The box 232 represents a step where the emitter mesa 74 of the HBT structure is patterned and etched. Base metal is then evaporated on the developing HBT 52 and is patterned to form the base contact 68 as represented by Box 234. Next, the mesas that form the HBT base layer 66, the Schottky diode layers 80 and 86 and the PIN diode layers 122, 124 and 126 are patterned and etched as represented by Box 236. Ohmic metal is then evaporated on the developing HBT 52 structure and is patterned to form the collector contact 62 and the emitter contact 76 as represented by Box 238. Next, the emitter contact 76, the base contact 68 and the collector contact 62 are annealed as represented by Box 240.

If an HEMT or MESFET is being monolithically integrated with the PIN diode 132, as shown in FIG. 5, then after the HEMT or MESFET metal deposition step of the Box 230, the mesas that form PIN diode layers 138, 142, 144 and 146 are etched as represented by Box 242. Next, the p-type ohmic contact 148 and the n-type ohmic contact 140 are evaporated, as represented by Box 244. The ohmic contacts 140 and 148 are then thermally annealed as represented by Box 246.

After the mesas and ohmic contacts have been formed on either the HBT 52 or the PIN diode 112, as discussed above, the next step is device isolation by an oxygen ion implantation step as represented by 248. For the integrated device 50, the ion implantation region 82 separates the HBT 52 from the Schottky diode 54. For the integrated device 110, the ion implantation step separates the HBT 112 from the PIN diode 114. Next, the T-gate terminal 106 of the HEMT 56 or a T-gate terminal associated with an MESFET is written by electron beam lithography (EBL) to form its shape as represented by step 250. Next, a silicon nitride passivation layer (not shown) is deposited over the entire monolithically formed integrated circuit 50, 110 and 130, and vias are formed to the appropriate terminals as represented by box 252. Thin film resistors, capacitors, inductors, airbridges and interconnect metalization (not shown) are then defined within each HBT, HEMT, MESFET, PIN diode, and Schottky diode and between these devices as represented by Box 254. Pad vias and backside vias (not shown) are then formed as represented by Box 256. Finally, a backside metal planar layer (not shown) is formed over the entire integrated device 50 and 110 as represented by Box 258.

For the integrated circuit 156 of FIGS. 6 and 8, and the integrated circuit 174 of FIG. 7, after the step of the box 230, the HBT emitter mesa is etched as indicated by the box 232, and the HBT base contact and the p-type PIN diode contact of the boxes 234 and 244 are performed. The HBT base layer and the Schottky diode mesas are then formed as shown by the box 236, and the PIN diode mesa is formed as represented by the box 242. Next, the HBT emitter contact and collector contact are evaporated and annealed in accordance with the boxes 238 and 240. Next, the PIN diode contact is annealed in accordance with the box 246. The process then picks up at the box 248 as discussed above.

Figure 10:
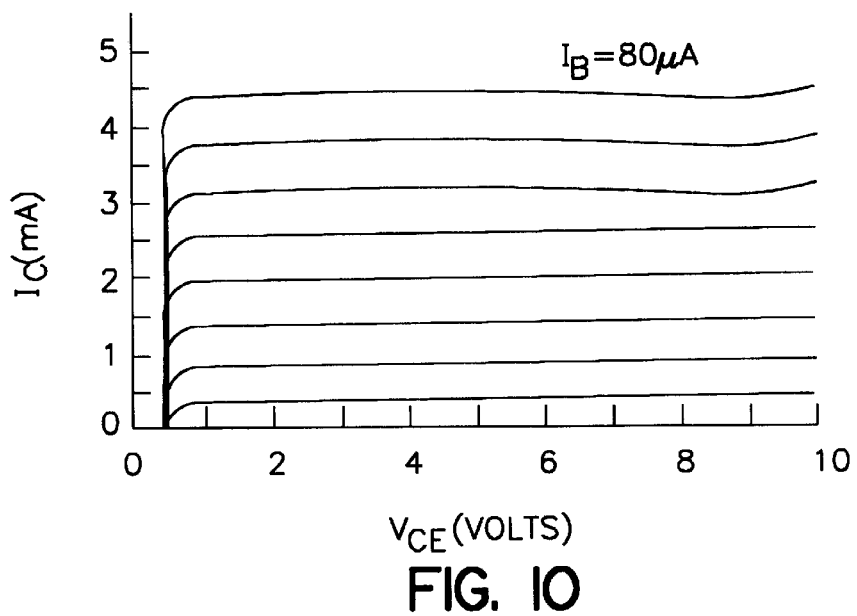
FIG. 10 is a graph showing current (I) versus voltage (V) curves of a 2×10 $\mu$m single-emitter HBT that has been fabricated by a method of forming a monolithically integrated HEMT-HBT device according to an embodiment of the present invention.

DC and microwave performance results of discrete HEMTs and HBTs fabricated using the merged HEMT-HBT process described above are equivalent to those of discrete devices fabricated using known baseline single device technology processes. FIG. 10 shows a graph of current (I) in the vertical axis and voltage (V) on the horizontal axis displaying the I-V characteristics of a 2×10 μm single-emitter HBT fabricated by the HEMT-HBT monolithic process discussed above. The HBT breakdown voltage $V_{ceo}$ is greater than 10V. The early voltage is greater than 500 volts, and β is about 56 at $I_c$=4.5 mA. The knee voltage is normal indicating that no additional collector resistance is induced during the selective MBE process of the invention. The base-emitter voltage $V_{be}$=1.1539V at 1 mA, and is typical for this device geometry at this current density. Any significant base dopant diffusion into the graded AlGaAs emitter, or any increased emitter resistance would result in an increased $V_{be}$. The emitter specific contact resistance is $1.1\times10^{-7}$ Ω-cm², typical for a device of this type, and indicates that no degradation of the HBT InGaAs emitter contact during the subsequent HEMT growth. Large HBT devices with 75×75 μm² emitters had an average β=102 at $I_c$=1 mA (19A/cm²) and β=175 at $I_c$=40 mA (711 A/cm²), with an ideality factor for the base-emitter junction diode of n=1.03.

Figure 11:
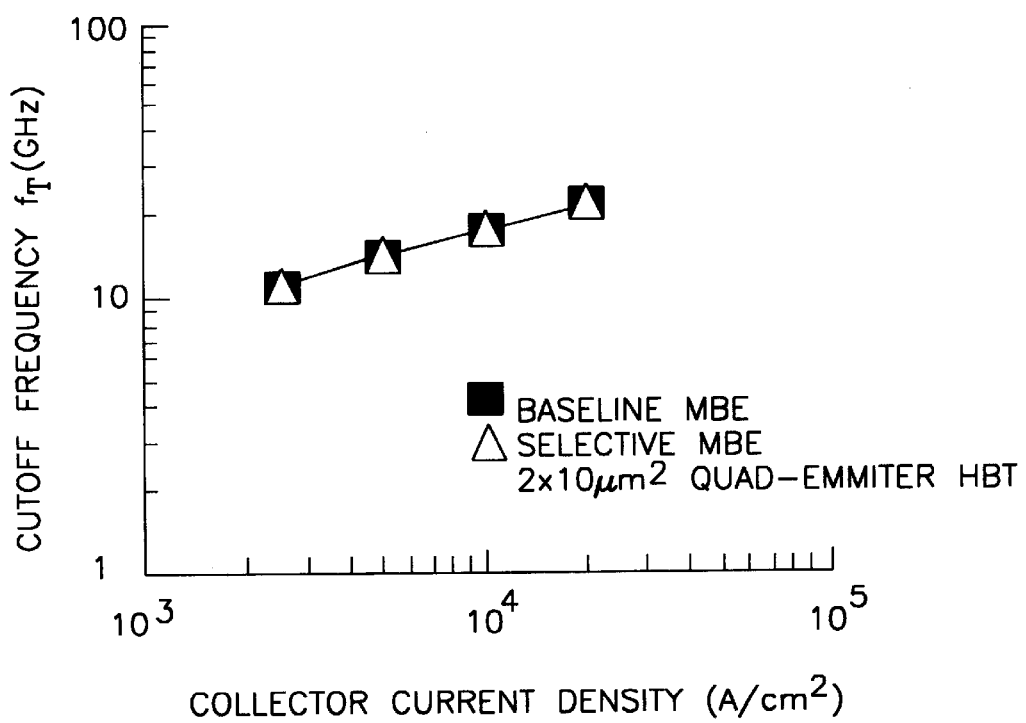
FIG. 11 is a graph of cut-off frequency ($f_T$) versus collector current density for a 2×10 $\mu$m quad-emitter HBT fabricated by a known baseline molecular beam epitaxy fabrication method and a method of forming a monolithically integrated HEMT-HBT device according to an embodiment of the present invention.

HBT devices having a quad-emitter of 2×10 μm² had a cut-off frequency $f_T$=21.4 GHz and $f_{max}$=50 GHz at $I_c$=16 mA (2×10⁴ A/cm²) typical for these types of devices. A plot of $f_T$ versus collector current density for baseline and selective MBE HBTs is shown in FIG. 11. The recorded values are essentially identical across the measured current range. The equivalence of dc and rf results for HBTs fabricated by baseline and selective MBE processes according to the invention indicates that no significant degradation in HBT material properties has occurred during the HEMT-HBT integration process.

Figure 12:
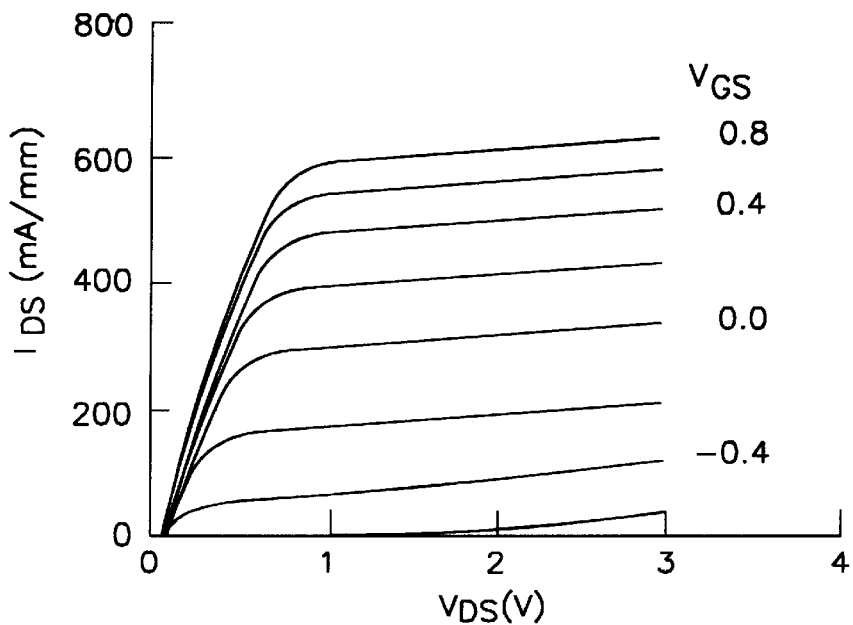
FIG. 12 shows a graph of current versus voltage curves for a T-gate HEMT that has been monolithically fabricated with an HBT according to an embodiment of the present invention.

Low-noise pseudomorphic InGaAs-GaAs 0.2 μm T-gate HEMTs fabricated monolithically with GaAs-AlGaAs HBTs have dc and rf characteristics equivalent to those of HEMTs fabricated by known baseline processes. The I-V characteristic curves for a 2-finger 80 μm gate-width HEMT device is shown in FIG. 12.

Figure 13A:
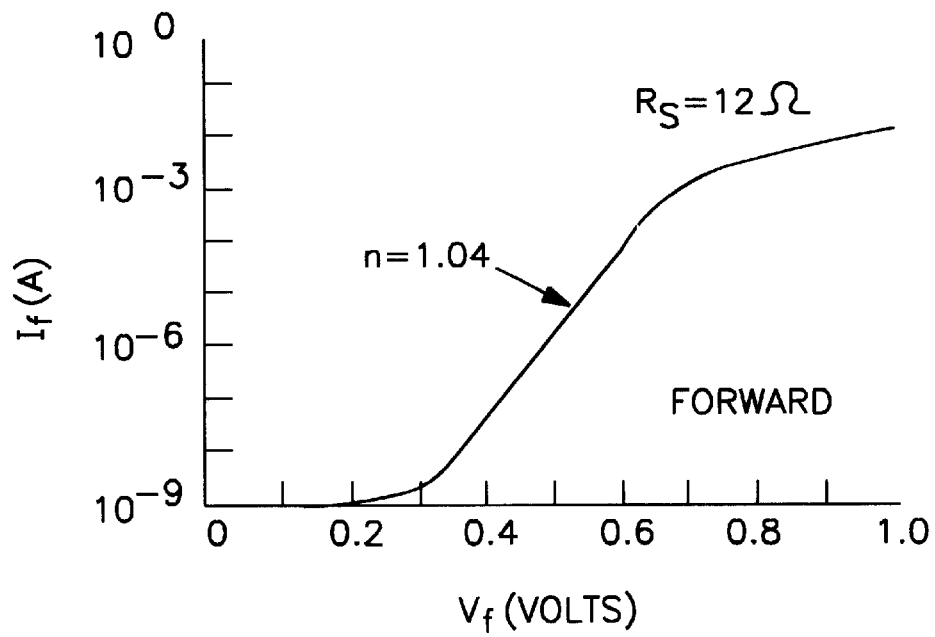
FIGS. 13(a)–13(b) show graphs of forward and reverse bias current and voltage characteristics for a PIN diode fabricated monolithically with an integrated HEMT-HBT device according to an embodiment of the present invention.
Figure 13B:
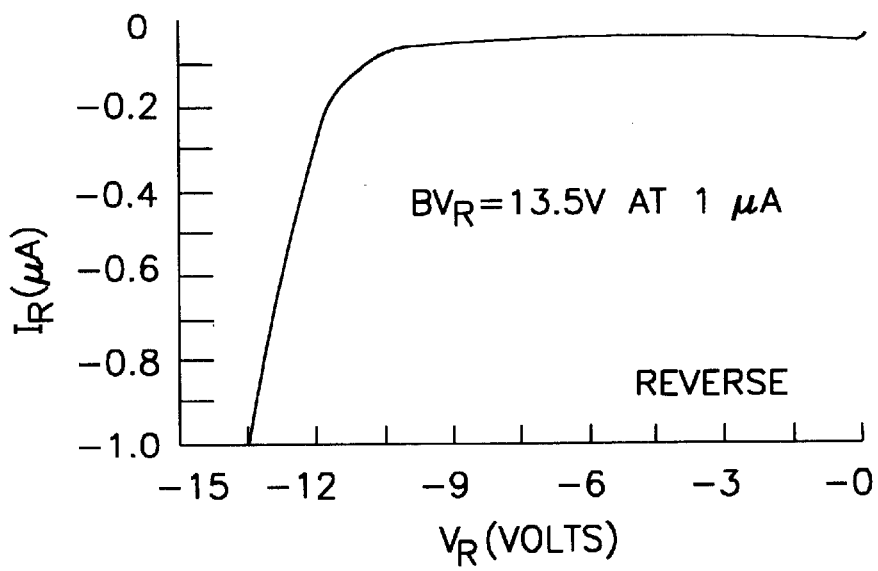

Forward and reverse I-V characteristics for the THz Schottky diode 54 fabricated from the HBT collector-subcollector region of the integrated device 50 are shown in FIGS. 13(a)–13(b). The diode ideality factor of n=1.04, series resistance of 12Ω, and a breakdown voltage of approximately 13V are typical for a Schottky diode of this type when fabricated by a known baseline HBT process.

Figure 14:
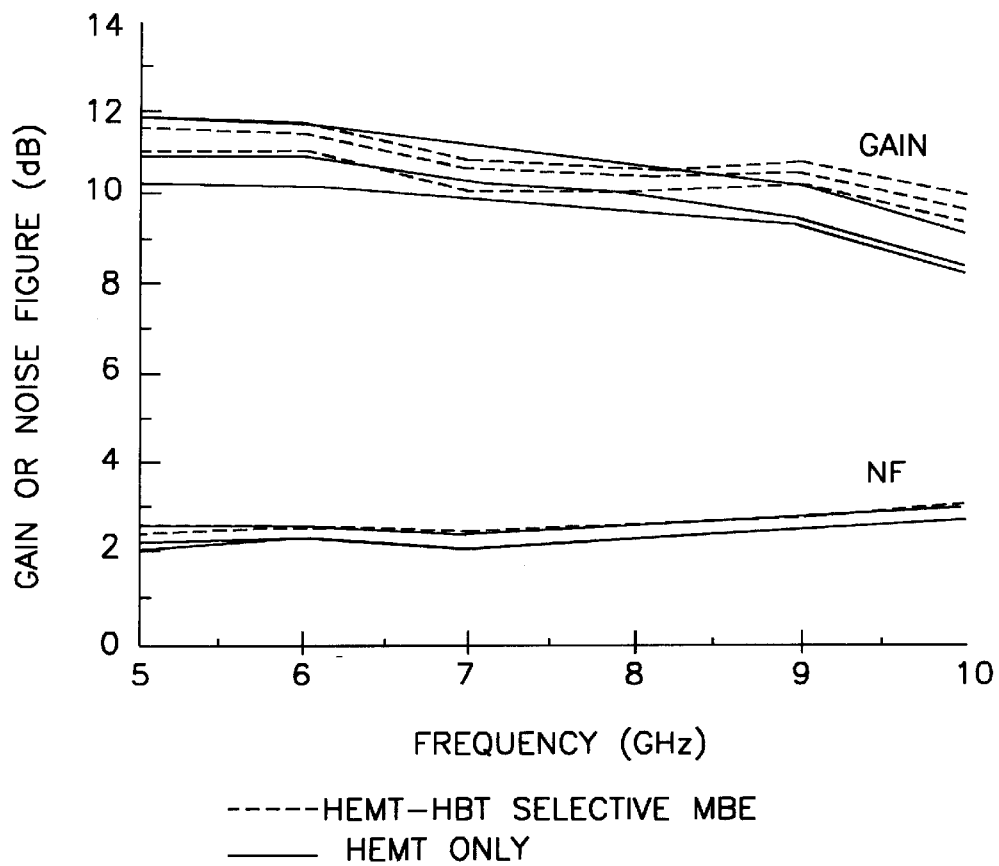
FIG. 14 shows a graph comparing gain and noise versus frequency between an HBT amplifier fabricated by a baseline technique and an HBT amplifier associated with a monolithically integrated HEMT-HBT device according to an embodiment of the present invention.

The performance of a monolithic HEMT-HBT integrated circuit device that uses active HBT regulation of an HEMT low-noise amplifier is shown in FIG. 14. The amplifier was designed for 5–10 GHz bandwidth, nominal gain greater than 10 dB, and noise figure of less than 3 dB. The HEMT low-noise amplifier is a single stage feedback design using a single 0.2 μm T-gate HEMT which is 200 μg in length. The bias current of the HEMT device can be regulated to within 5% over a threshold variation of ±0.5V using an on-chip HBT current regulator, which consumes 5 mA through a 10V positive supply voltage. The same amplifier without the HBT regulator was fabricated in the HEMT-only technology for comparison. Gain and noise figure for amplifiers fabricated using the selective MBE process according to the present invention, and a known baseline single-technology are nearly identical as shown in FIG. 14. The HEMT amplifiers fabricated by the merged HEMT-HBT process actually have a slight gain advantage near 10 GHz. This is probably due to normal variations in the process.

Monolithic integration of HEMTs and HBTs on the same integrated circuit provides microwave circuits with performance levels unattainable using separate device generation technology. The design opportunities when using both HEMT and HBT devices on the same chip are extensive, especially when combined with THz Schottky diodes and PIN diodes. For example, the monolithic integration of microwave and digital functions can significantly improve receiver performance. Novel circuit designs, such as TTL-controlled phase shifters, low-noise high-power transmitter-receive modules, FMCW single-chip radar circuits that incorporate HBT variable control oscillators with HEMT low-noise amplifiers are all possible using monolithic integration of high-performance HEMTs and HBTs. In addition, superconducting detectors, mixers, transmission lines and digital circuits can be incorporated with MESFET, HEMT, HBT or PIN-diode circuits to increase performance to cryogenic temperatures.

FIGS. 15–18 show circuit examples of HEMT-HBT, PIN diode-HEMT and PIN diode-HBT-HEMT circuits that could gain advantages from being monolithically integrated in the manner discussed above. Each of the circuits of FIGS. 15–18 are known in the art in that hybrid or separate chip implementations have been extensively developed. With the invention as discussed above, the individual circuit components of these circuits can be monolithically integrated on a common substrate. In other words, one skilled in the art could interconnect the integrated circuits discussed above to arrive at the circuits of FIGS. 15–18. Monolithically integrated circuits of these types have heretofore not been shown in the prior art. By monolithically integrating the different circuit components on a common substrate, many advantages including, but not limited to, lower transition losses between the circuit components, less area requirements, less cost, compactness and higher performance can be realized with the monolithically integrated circuits.

Figure 15:
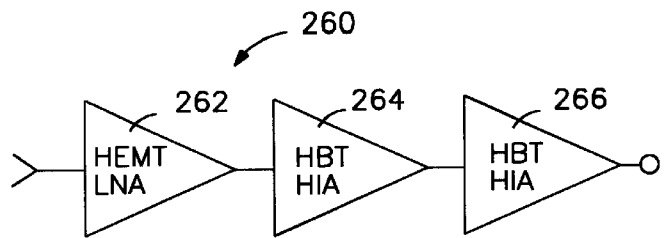
FIG. 15 shows a schematic diagram of a high performance amplifier that integrates a low-noise HEMT front end with HBT high intercept amplifiers.

FIG. 15 shows a high performance amplifier 260, known in the art, that provides a low-noise front end, high impedance and low distortion of the third harmonic, optimum sensitivity and high power. The amplifier 260 includes an HEMT low noise amplifier 262 that receives an rf signal and applies an amplified output signal to first and second HBT high intercept amplifiers (HIA) 264 and 266. By monolithically integrating the amplifiers 262, 264 and 266 on a common substrate, the known advantages of this circuit can be increased.

Figure 16:
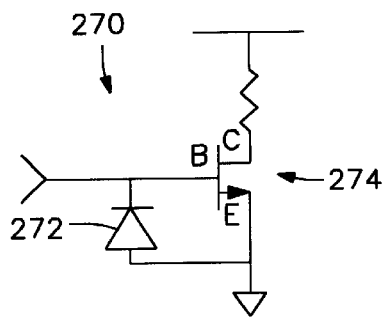
FIG. 16 shows a schematic diagram of a PIN diode limiter integrated with an HEMT low-noise amplifier.

Because HEMT amplifiers burn out readily easily at high input power, it is known in the art to provide a PIN diode limiter connected to the base (B) and emitter (E) terminals of an HEMT amplifier in order to protect the HEMT amplifier against such high input signals. FIG. 16 shows a circuit 270 of this type of HEMT amplifier. The circuit 270 includes a PIN diode limiter 272 where the anode of the diode limiter 272 is connected to the base terminal of an HEMT 274 and the cathode of the diode limiter 270 is connected to the emitter terminal of the HEMT amplifier 274. The diode limiter 272 shunts input overload signals applied to the base of the HEMT 274 so as to protect the HEMT 274 from signal overload and burnout. By monolithically integrating the diode limiter 272 and the HEMT 274 on a common substrate in the manner as discussed above, many advantages over prior art circuits of this type can be realized.

Figure 17:
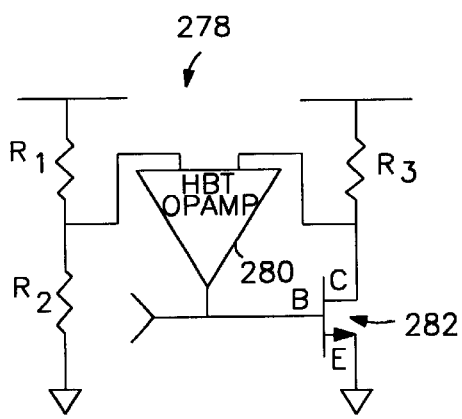
FIG. 17 shows a schematic diagram of an HBT regulator integrated with an HEMT low-noise amplifier.

FIG. 17 shows an HBT-regulated HEMT low-noise amplifier 278. Because the characteristics of an HEMT amplifier significantly changes over time, it is known in the art to provide an HBT operational amplifier (OPAMP) in order to regulate the input signal being applied to the base terminal of the HEMT amplifier. For the amplifier 278, input signals are applied to the input terminals of an HBT operational amplifier 280. An output signal of the HBT operational amplifier 280 is applied to a base terminal of an HEMT low-noise amplifier 282 to achieve the regulation. By monolithically integrating the HBT operational amplifier 280 and the HEMT amplifier to 282 on a common substrate in the manner as discussed above, certain advantages, such as lower transition losses between circuit components, can be realized over the prior art HBT-regulated HEMT low-noise amplifiers.

Figure 18:
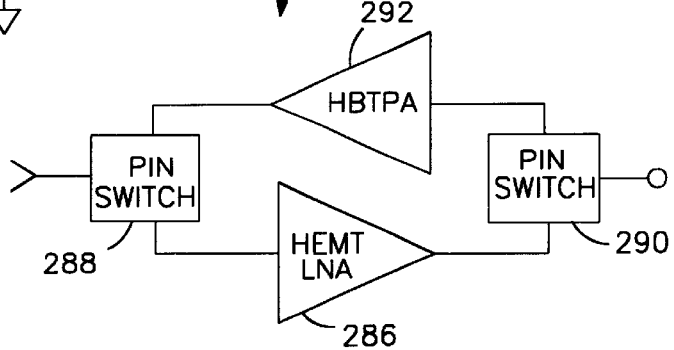
FIG. 18 is a schematic diagram of a transmit-receive module that uses an HEMT low noise amplifier for receive functions, a PIN diode switch using either an HBT base-collector PIN or a separate PIN, and an HBT power amplifier for the transmit function.

FIG. 18 shows a transmit-receive module 284, known in the art, in a block diagram form, that uses an HEMT low-noise amplifier 286 for the receive function, PIN diode switches 288 and 290, and an HBT power amplifier 292 for the transmit function. The operation of a transmit-receive module configured in this manner is well known in the art. By monolithically integrating the HEMT amplifier 286, the PIN-diode switches 288 and 290, and the HBT power amplifier 292 on a common substrate in the manner as discussed above, certain advantages over the prior art transmit-receive modules incorporating these components can be realized.

The applications for monolithic PIN-HEMT-HBT integrated circuits and for superconducting film integration with each of the discussed technologies is not limited to the specific circuits or applications disclosed herein. The techniques disclosed are applicable to fabrication of a variety of novel microwave and optoelectronic circuits that incorporate HEMT, HBT, PIN-diode, MESFET, or superconducting films in a variety of combinations to achieve a variety of advantages not currently available with single fabrication technologies alone.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method of fabricating monolithically integrated circuit devices on a common substrate by a process of selective molecular beam epitaxy (MBE), said method comprising the steps of:

depositing a first semiconductor profile on the substrate by the MBE process;

depositing a first dielectric layer on the semiconductor profile;

removing a portion of the first dielectric layer and the first semiconductor profile at selected areas so that a portion of the first semiconductor profile defining a first semiconductor device profile remains on the substrate and a first portion of the substrate is exposed, said first semiconductor device profile being covered by a first remaining dielectric layer, wherein the step of removing a portion of the first dielectric layer and the first semiconductor profile includes anisotropically etching the semiconductor profile to form a retrograde semiconductor profile so that a portion of the first remaining dielectric layer includes an overhang area that extends beyond a top surface of the first semiconductor device profile;

depositing a second semiconductor profile on the first remaining dielectric layer and the first exposed portion of the substrate by the MBE process;

removing a portion of the second semiconductor profile that was deposited on the first remaining dielectric layer and removing the first remaining dielectric layer to form a second remaining semiconductor profile adjacent to the first semiconductor device profile on the substrate;

depositing a second dielectric layer on the first semiconductor device profile and the second remaining semiconductor profile, and removing the second dielectric layer and a portion of the second remaining semiconductor profile at selected areas so that a portion of the second remaining semiconductor profile defining a second semiconductor device profile remains on the substrate and a second portion of the substrate is exposed, said first semiconductor device profile and said second semiconductor device profile being different from each other and covered by a second remaining dielectric layer;

depositing a high electron mobility transistor (HEMT) profile on the second remaining dielectric layer and the second exposed portion of the substrate by the MBE process so that a single crystalline HEMT profile is deposited on the second exposed portion of the substrate and a polycrystalline HEMT profile is deposited on the second remaining dielectric layer; and removing the polycrystalline HEMT profile that was deposited on the second remaining dielectric layer and removing the second remaining dielectric layer to form a HEMT device profile on he common substrate that is different from said first semiconductor device profile and said second semiconductor device profile.

2. The method according to claim 1 wherein the step of depositing a first semiconductor profile includes depositing a heterojunction bipolar transistor (HBT) profile on the substrate so as to form integrated HBT and HEMT device profiles on the substrate.

3. The method according to claim 2 further comprising the steps of first depositing an ohmic metal layer on the HEMT device profile, then patterning the ohmic metal layer to define a source terminal and a drain terminal associated with the HEMT device profile, then patterning an HBT emitter mesa from the HBT device profile, then depositing and patterning an HBT base contact, then patterning an HBT base mesa from the HBT device profile, then depositing and patterning an HBT emitter contact and an HBT collector contact, and then depositing and patterning an HEMT gate electrode.

4. The method according to claim 2 further comprising the step of implanting ions into a region of the HBT device profile so as to isolate and separate a portion of the HBT device profile to form a diode device profile from the separated portion of the HBT device profile adjacent to the HBT device profile.

5. The method according to claim 1 wherein the step of depositing a first semiconductor profile includes depositing a PIN diode profile so as to form integrated PIN diode and HEMT device profiles on the common substrate.

6. The method according to claim 1 wherein the substrate includes a material selected from the group consisting of Gallium Arsenide (GaAs) and Indium Phosphide (InP).

7. The method according to claim 1 wherein the step of depositing a first dielectric layer includes depositing a silicon nitride dielectric layer.

8. The method according to claim 1 wherein the step of depositing a first semiconductor profile includes depositing a PIN-diode profile and the step of depositing a second semiconductor profile includes depositing an HBT profile.

9. The method according to claim 1 wherein the step of depositing a second semiconductor profile includes depositing a single crystalline semiconductor profile on the first exposed portion of the substrate and a polycrystalline semiconductor profile on the remaining dielectric layer.

10. A method of fabricating monoliticaly integrated circuit devices on a common substrate by a process of selective molecular beam epitaxy (MBE), said method comprising the steps of:

depositing a first semiconductor profile on the substrate by the MBE process;

depositing a first dielectric layer on the first semiconductor profile;

removing portions of the first dielectric layer and the first semiconductor profile at selected areas so that a portion of the first semiconductor profile defining a semiconductor device profile remains on the substrate and a first portion of the substrate is exposed, said first semiconductor device profile being covered by a first remaining dielectric layer, wherein the step of removing portions of the first dielectric layer and the first semiconductor profile includes anisotropically etching the first semiconductor profile to form a retrograde semiconductor profile so that a portion of the first remaining dielectric layer includes an overhang area that extends beyond a top surface of the first semiconductor device profile;

depositing a second semiconductor profile on the first remaining dielectric layer and the first exposed portion of the substrate by the MBE process;

removing a portion of the second semiconductor profile that was deposited on the first remaining dielectric layer and removing the first remaining dielectric layer to form a second remaining semiconductor profile adjacent to the first semiconductor device profile on the substrate;

depositing a second dielectric layer on the first semiconductor device profile and the second remaining semiconductor profile, and removing the second dielectric layer and a portion of the second remaining semiconductor profile at selected areas so that a portion of the second remaining semiconductor profile defining a second semiconductor device profile remains on the substrate and a second portion of the substrate is exposed, said first semiconductor device profile and said second semiconductor device profile being different from each other and covered by a second remaining dielectric layer;

depositing a metal semiconductor field effect transistor (MESFET) profile on the second remaining dielectric layer and the second exposed portion of the substrate by the MBE process so that a single crystalline MESFET profile is deposited on the second exposed portion of the substrate and a polycrystalline MESFET profile is deposited on the second remaining dielectric layer;

removing the polycrystalline MESFET profile that was deposited on the second remaining dielectric layer and removing the second remaining dielectric layer to form a MESFET device profile on the common substrate that is different from said first semiconductor device profile and said second semiconductor device profile.

11. The method according to claim 10 wherein the step of depositing a first semiconductor profile includes depositing a heterojunction bipolar transistor (HBT) profile on the substrate so as to form an integrated HBT and MESFET device profiles on the substrate.

12. The method according to claim 10 wherein the step of depositing a first semiconductor profile includes depositing a PIN diode profile so as to form integrated PIN diode and MESFET device profiles on the common substrate.

13. The method according to claim 10 wherein the step of depositing a first semiconductor profile includes depositing an HBT profile and the step of depositing a second semiconductor profile includes depositing a PIN diode profile.

14. The method according to claim 10 wherein the step of depositing a second semiconductor profile includes depositing a single crystalline semiconductor profile on the first exposed portion of the substrate and a polycrystalline semiconductor profile on the first remaining dielectric layer.

15. A method of fabricating monolithically integrated circuit devices on a common substrate by a process of selective molecular beam epitaxy (MBE), said method comprising the steps of:

depositing a heterojunction bipolar transistor (HBT) profile on the substrate by the MBE process;

depositing a first dielectric layer on the HBT profile;

removing a portion of the first dielectric layer and the HBT profile at selected areas so that a portion of the HBT profile defining an HBT device profile remains on the substrate and a first portion of the substrate is exposed, said HBT device profile being covered by a first remaining dielectric layer, wherein the step of removing portions of the first dielectric layer and the HBT profile includes anisotropically etching the HBT profile to form a retrograde HBT device profile so that a portion of the first remaining dielectric layer includes an overhang area that extends beyond a top surface of the HBT device profile;

depositing a PIN diode profile on the first remaining dielectric layer and the first exposed portion of the substrate by the MBE process so that a single crystalline diode profile is deposited on the exposed portion of the substrate and a polycrystalline diode profile is deposited on the first remaining dielectric layer;

removing the polycrystalline diode profile that was deposited on the first remaining dielectric layer and removing the first remaining dielectric layer to form a PIN diode remaining profile adjacent to the HBT device profile on the common substrate;

depositing a second dielectric layer on the HBT device profile and the PIN diode remaining profile, and removing the second dielectric layer and a portion of the PIN diode remaining profile at selected areas so that a portion of the PIN diode remaining profile defining a PIN diode device profile on the substrate and a second portion of the substrate is exposed, said HBT device profile and said PIN diode device profile being covered by a second remaining dielectric layer;

depositing an HEMT profile on the second remaining dielectric layer and the second exposed portion of the substrate by the MBE process so that a single crystalline HEMT profile is deposited on the second exposed portion of the substrate and a polycrystalline HEMT profile is deposited on the second remaining dielectric layer;

removing the polycrystalline HEMT profile that was deposited on the second remaining dielectric layer and removing the second remaining dielectric layer to form integrated HBT device profile, PIN diode device profile and HEMT device profile on the common substrate.

* * * * *